(12) United States Patent
Misawa et al.

(10) Patent No.: US 7,221,206 B2
(45) Date of Patent: May 22, 2007

(54) INTEGRATED CIRCUIT DEVICE HAVING CLOCK SIGNAL OUTPUT CIRCUIT

(75) Inventors: Katsutoyo Misawa, Nukata-gun (JP); Yasuyuki Ishikawa, Kariya (JP); Akira Suzuki, Nukata-gun (JP); Yoshinori Teshima, Toyota (JP); Hideaki Ishihara, Okazaki (JP)

(73) Assignee: Denso Corporation, Kariya (JP)

( * ) Notice: Subject to any disclaimer, the term of this patent is extended or adjusted under 35 U.S.C. 154(b) by 29 days.

(21) Appl. No.: 11/075,882

(22) Filed: Mar. 10, 2005

(65) Prior Publication Data

US 2005/0206461 A1    Sep. 22, 2005

(30) Foreign Application Priority Data

Mar. 18, 2004   (JP)   ............................. 2004-078247
Mar. 22, 2004   (JP)   ............................. 2004-082580

(51) Int. Cl.
G06F 1/04   (2006.01)

(52) U.S. Cl. ..................... 327/291; 327/310; 327/551

(58) Field of Classification Search ................ 327/291, 327/306, 309–311, 530, 551, 379
See application file for complete search history.

(56) References Cited

U.S. PATENT DOCUMENTS 5,565,817 A * 10/1996 Lakshmikumar ............. 331/57
5,764,111 A * 6/1998 Bushman ..................... 331/57
5,789,808 A * 8/1998 Yamasaki et al. ........... 257/693
5,789,985 A   8/1998 Yamauchi et al. .......... 331/1 A
5,917,765 A * 6/1999 Morishita et al. ........... 365/201
6,166,990 A * 12/2000 Ooishi et al. ................ 365/233
6,407,606 B1   6/2002 Miura ......................... 327/241
6,675,301 B1 * 1/2004 Kurosawa .................... 713/300
6,741,507 B2 * 5/2004 Iwamoto ...................... 365/194

FOREIGN PATENT DOCUMENTS

JP   A-2000-165234   6/2000
JP   A-2000-357947   12/2000
JP   A-2002-111484   4/2002

* cited by examiner

Primary Examiner—Timothy P. Callahan
Assistant Examiner—Hai L. Nguyen
(74) Attorney, Agent, or Firm—Posz Law Group, PLC

(57) ABSTRACT

Integrated circuit device includes: a wiring; a clock signal output circuit including a ring oscillator; an internal circuit; an internal power supply generation circuit for supplying an electric power to the clock signal output circuit and to the internal circuit on the basis of a power supplied from an external circuit; and a capacitor connection terminal. The internal power supply generation circuit supplies the electric power to the ring oscillator through the wiring connecting between the internal power supply generation circuit and the capacitor connection terminal. The internal power supply generation circuit supplies the electric power to the internal circuit through the wiring connecting to the capacitor connection terminal.

16 Claims, 11 Drawing Sheets

INTEGRATED CIRCUIT DEVICE HAVING CLOCK SIGNAL OUTPUT CIRCUIT

CROSS REFERENCE TO RELATED APPLICATIONS

This application is based on Japanese Patent Applications No. 2004-78247 filed on Mar. 18, 2004, and No. 2004-82580 filed on Mar. 22, 2004, the disclosures of which are incorporated herein by reference.

FIELD OF THE INVENTION

The present invention relates to an integrated circuit device having a clock signal output circuit.

BACKGROUND OF THE INVENTION

Recently, operating clock frequencies have been increased in integrated circuit devices such as microcomputers. For this reason, the following constitution is frequently adopted: a clock multiplication circuit constructed using a PLL (i.e., Phase Locked Loop) circuit is incorporated in an integrated circuit device; and externally supplied clock signals are internally multiplied, and supplied to CPU and the like. Some of such clock multiplication circuits are so constructed that multiplied clock signals are generated and outputted by digital PLL (i.e., DPLL) operation using a ring oscillator.

Ring oscillators are constructed by annularly connecting a plurality of delay gates (e.g. NOT gates), and generate high-speed clock signal by digital oscillating operation. However, in the NOT gates and the like, the gate delay time is varied according to supply voltage. When the supply voltage fluctuates, the frequency of multiplied clock signals outputted from a multiplication circuit also fluctuates. This is a jitter effect.

For this reason, when a multiplication circuit of the above-mentioned constitution is used, the following measures are taken: an internal power supply generation circuit constructed of a series regulator and the like is incorporated in an integrated circuit device. Thus, even when supply voltage externally supplied fluctuates, stable voltage can be supplied to a clock multiplication circuit, other internal circuits, and the like.

There are various technologies for stabilizing the oscillating operation of a clock multiplication circuit. For example, Japanese Unexamined Patent Publication No. 2000-165234 discloses a PLL circuit. This PLL circuit is so constructed that it comprises: a first PLL module that uses as operating power supply internal voltage generated by an internal power supply generation circuit, and generates intermediate clock signals based on an externally supplied reference clock signal; and a second PLL module that uses external power supply as operating power supply, and generates internal clock signals based on the above-mentioned intermediate clock signals.

Japanese Unexamined Patent Publication No. 2002-111484 discloses another technology. In this technology, a PLL circuit is so constructed that it comprises: a phase comparator; a first circuit that forms a signal of a level corresponding to the output signal of the phase comparator; and a second circuit that generates a clock signal of a frequency corresponding to the output level of the first circuit. A low-pass filter is placed between the power supply terminal of the first circuit and the power supply terminal of the second circuit. Thus, noise produced in the second circuit is prevented from being transmitted to the first circuit through a power line, and reduction of jitter effect is accomplished in the PLL circuit.

In the internal circuit of an integrated circuit such as a digital circuit that operates with supply of a multiplied clock signal, the following occurs: the consumption current varies according to the state of operation of a circuit portion that operates in synchronization with clock. Therefore, when internal power supply stabilized by an internal power supply generation circuit is supplied both to a multiplication circuit and to the internal circuit, a problem arises. The internal supply voltage fluctuates depending on the operating state on the internal circuit side. However, the technologies according to the prior arts do not give consideration to this problem at all, and with these technologies, occurrences of jitter effect due to fluctuation in internal supply voltage cannot be avoided.

Further, for example, single-chip microcomputers are mounted with clock signal output circuits for generating and supplying system clock signals. Some of the clock signal output circuits are provided with a function of multiplying the frequency of a clock signal to cope with increase in the operating clock frequency of microcomputers. When a clock signal of a constant frequency is continuously outputted, sharp noise peaks are produced in its fundamental frequency and harmonic content. When CPU or a peripheral circuit operates in synchronization with the clock signal, power consumption more greatly fluctuates, and the noise level is further raised.

One of technologies for solving the above problem is disclosed in Japanese Unexamined Patent Publication No. 2001-148690, which corresponds to U.S. Pat. No. 6,407,606. As illustrated in FIG. 16, this technology is such that: a clock forming unit 101 so constructed that it comprises a ring oscillator is used to generate clock signals in m-phases whose frequencies are identical and whose phases are shifted by a certain amount. The clock signals are supplied to a selection processing unit 102. A dithering control unit 103 supplies the selection processing unit 102 with a control signal and causes the unit 102 to select one from among clock signals in m-phases in sequence. The dithering control unit 103 causes the selection processing unit 102 to output it from an output terminal 104. Thus, the phase of the clock signals is caused to disperse the peaks in frequency spectrum with respect to noise.

However, there is a problem in realizing the constitution disclosed in Japanese Unexamined Patent Publication No. 2001-148690. In addition to the clock forming unit 101 that generates clock signals in m phases, the dithering control unit 103 and the selection processing unit 102 must be provided. Therefore, an additional circuit area is required on the chip of the microcomputer.

SUMMARY OF THE INVENTION

In view of the above-described problem, it is an object of the present invention to provide an integrated circuit device having a clock signal output circuit. The device has low noise without fluctuating a frequency of a clock signal. Further, the device has simple construction without adding any extra circuit.

Integrated circuit device includes: a wiring; a clock signal output circuit including a ring oscillator, wherein the ring oscillator includes a plurality of delay gates, which is connected each other annularly and generates a clock signal with a frequency of a reference clock signal, and wherein the clock signal output circuit generates and outputs a multiplied clock signal obtained by multiplying the frequency of the reference clock signal with a digital phase locked loop method on the basis of the clock signal; an internal circuit operated on the basis of the multiplied clock signal; an internal power supply generation circuit for supplying an electric power to the clock signal output circuit and to the internal circuit on the basis of a power supplied from an external circuit, wherein the electric power is stabilized by reducing a voltage of the power from the external circuit; and a capacitor connection terminal for connecting an external noise reduction capacitor to the wiring connecting to the internal circuit. The wiring connects among the clock signal output circuit, the internal circuit and the internal power supply generation circuit. The internal power supply generation circuit supplies the electric power to the ring oscillator through the wiring connecting between the internal power supply generation circuit and the capacitor connection terminal. The internal power supply generation circuit supplies the electric power to the internal circuit through the wiring connecting to the capacitor connection terminal.

In the above device, even when an internal power supply in the internal power supply generation circuit fluctuates so that a noise is generated in the wiring of the device in a case where the internal circuit is operated, the noise is reduced or removed by a low pass filter provided by a resistance component of the wiring and the external noise reduction capacitor. Accordingly, the influence of the fluctuation of the internal power supply is prevented from transmitting to the ring oscillator of the clock signal output circuit. Thus, the oscillation of the ring oscillator is stabilized so that the frequency of the multiplied clock signal becomes stable. Thus, the device has low noise without fluctuating the frequency of the clock signal. Further, the device has simple construction without adding any extra circuit.

Preferably, the device further includes an internal capacitor for reducing a noise. The wiring includes a wire lead frame. The wiring has a wiring impedance. The wire lead frame has another impedance. The internal capacitor has a capacitance. The external noise reduction capacitor has another capacitance. The wiring impedance of the wire, the other impedance of the wire lead frame, the capacitance of the internal capacitor and the other capacitance of the external noise reduction capacitor provide a filter for filtering the noise.

Preferably, the internal power supply generation circuit supplies the electric power to all parts composing the clock signal output circuit through the wiring connecting between the internal power supply generation circuit and the capacitor connection terminal. In this case, the power supply to be supplied to the ring oscillator and the other parts is not affected by the wiring impedance of the wiring. Thus, the operation of the clock signal output circuit is much stabilized.

Preferably, the clock signal output circuit further includes a first power supply terminal and a second power supply terminal. The first power supply terminal is capable of supplying the electric power to the ring oscillator, and the second power supply terminal is capable of supplying the electric power to all parts of the clock signal output circuit except for the ring oscillator. The first and the second power supply terminals are connected directly to the internal power supply generation circuit. In this case, the ring oscillator and the other parts in the clock signal output circuit are independently operated. Thus, the ring oscillator and the other parts are not affected each other.

Preferably, the device further includes an external power supply terminal for connecting to the external circuit. The internal circuit includes a power supply terminal only connecting to the external power supply terminal so that the internal circuit is energized through a connection between the capacitor connection terminal and the external power supply terminal, the connection being disposed outside of the device. In this case, the capacitor connection terminal and the external power supply terminal are connected at the connection portion outside of the device. The connection portion is provided by a wiring pattern on a circuit board for mounting the device. A power supply passage for supplying the electric power to the internal circuit is such that the passage passes from the internal power supply generation circuit, the capacitor connection terminal, the external wiring pattern, the external power supply terminal to the internal circuit. Thus, the external noise reduction capacitor is connected to the external wiring pattern, in which the power supply current flows. Accordingly, the external noise reduction capacitor can remove the noise effectively, compared with a device having the connection portion connecting to the capacitor connection terminal.

Preferably, the internal power supply generation circuit includes an output terminal for supplying the electric power, and the output terminal of the internal power supply generation circuit is disposed near a power supply terminal of the clock signal output circuit. More preferably, the output terminal of the internal power supply generation circuit and the power supply terminal of the clock signal output circuit are connected at a connection portion, and the wiring connecting between the capacitor connection terminal and the connection portion has a large wiring impedance. In this case, the wiring connecting between the power supply terminal and the capacitor connection terminal becomes longer. Accordingly, the noise to be transmitted from the internal circuit side is much reduced, since the resistance component of the wiring becomes larger.

Further, integrated circuit device includes: a clock signal output circuit including a ring oscillator, wherein the ring oscillator includes a plurality of delay gates, which is connected each other annularly and generates a clock signal with a frequency of a reference clock signal, and wherein the clock signal output circuit generates and outputs a multiplied clock signal obtained by multiplying the frequency of the reference clock signal with a digital phase locked loop method on the basis of the clock signal; an internal circuit operated on the basis of the multiplied clock signal; and a ground. The clock signal output circuit and the internal circuit are commonly energized from a power supply. The clock signal output circuit and the internal circuit are commonly grounded to the ground. The power supply supplies an electric power to the internal circuit firstly. The power supply supplies the electric power to the clock signal output circuit secondary.

In this case, the fluctuation in supply voltage caused by the internal circuit propagates to the clock signal output circuit side. As a result, the supply voltage of the clock signal output circuit is varied as well. Consequently, the delay times of delay gates constituting the ring oscillator vary according to supply voltage fluctuation. Therefore, the frequency of the oscillating operation in the ring oscillator varies. As a result, the frequency of the multiplied clock signal outputted from the clock signal output circuit varies as well. Therefore, the energy of unwanted radiated noise produced based on the multiplied clock signal is dispersed over wide frequency bands, and the peaks in noise level can be lowered. Therefore, a special circuit need not be constructed for varying the clock signal frequency. Thus, the integrated circuit device can be constructed in small size. Thus, the device has low noise without adding any extra circuit.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Hereafter, description will be given to a first embodiment of the present invention with reference to FIG. 1 to FIG. 8. FIG. 2 is a functional block diagram showing the general constitution of a clock signal output circuit 1 constructed of DPLL. (For detailed description of the constitution, refer to Japanese Unexamined Patent Publication No. H8-265111 (which corresponds to U.S. Pat. No. 5,789,985) or Japanese Unexamined Patent Publication No. 2000-357947.) A control circuit 2 is supplied with a reference clock signal PREF outputted from an oscillation circuit 3. The control circuit 2 has a state machine incorporated therein. The control circuit 2 is so designed as to output various control timing signals to DCO (i.e., Digital Controlled Oscillator) 4 and a counter-data latch circuit 5 based on a state counter outputted form the state machine.

Figure 3:
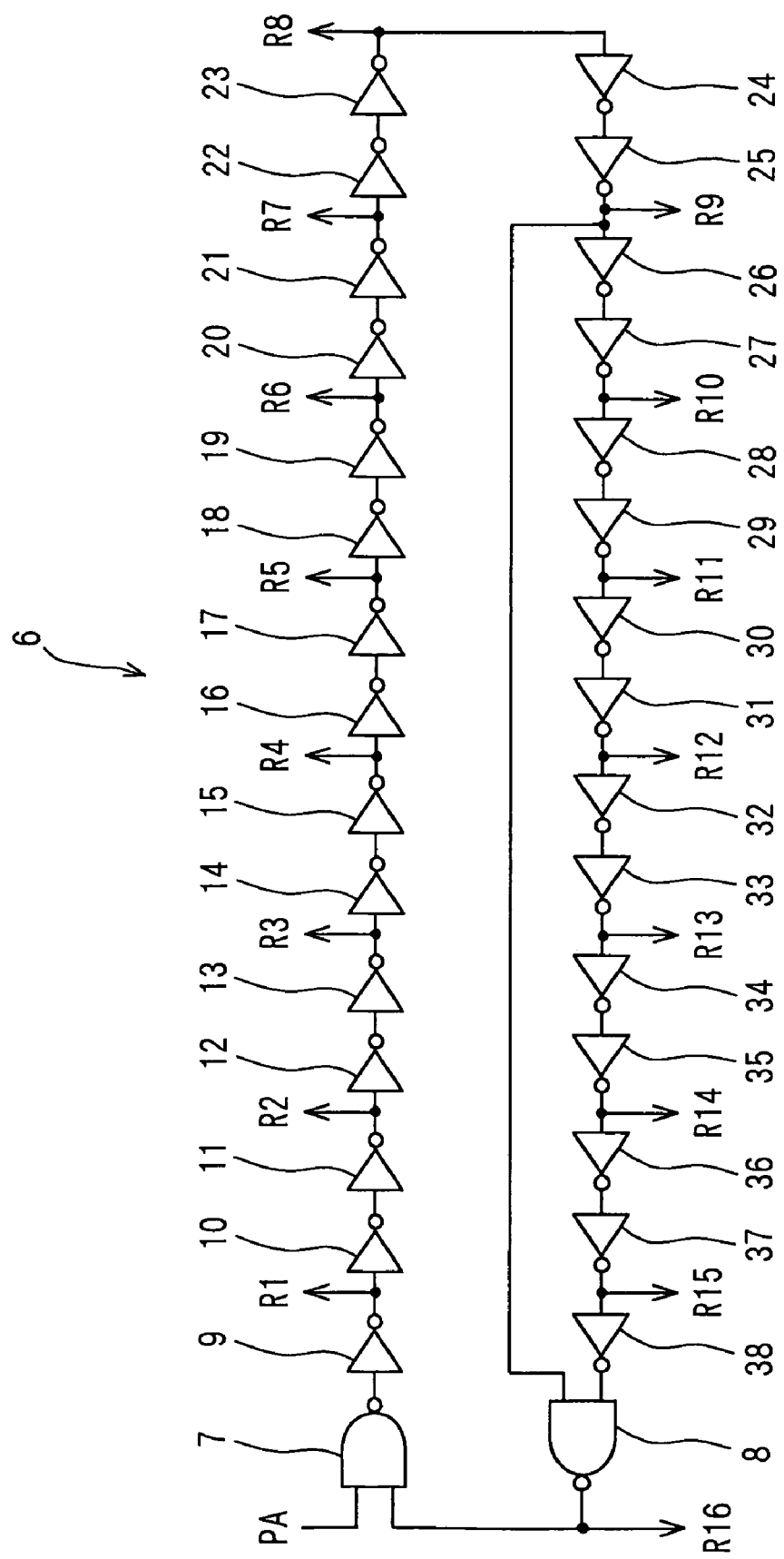
FIG. 3 is a schematic circuit diagram showing a ring oscillator in the microcomputer according to the first embodiment.

The DCO 4 provides a ring oscillator 6 therein. As illustrated in FIG. 3 as an example, the ring oscillator 6 is so constructed that it comprises two two-input NAND gates 7 and 8 as delay gates and 30 INV (i.e., inverter) gates 9 to 38. The output terminal of each of these logical inverting circuits is connected to the input terminal in the next stage, and thus they are annularly connected. One input terminal of the NAND gate 7 is connected to the output terminal of the NAND gate 8, and the other input terminal is externally supplied with a mode control signal PA.

One input terminal of the NAND gate 8 is connected to the output terminal of the INV gate 38, and the other input terminal is connected to the output terminal of the INV gate 25. multiple-phase clock signals R1 to R16 are respectively outputted from the output terminals of the logical inverting circuits connected in even-numbered stages, counted from the NAND gate 7.

As shown in FIG. 2, the counter-data latch circuit 5 is supplied with control timing signals UCE and ULR outputted from the control circuit 2. These control timing signals UCE and CLR have a pulse width equivalent to one period of the reference clock signal PREF. The control timing signals UCE and CLR are respectively outputted in the third and seventh periods of the sequence control period of the control circuit 2.

The counter-data latch circuit 5 is supplied with a clock signal R13 defined as RCK outputted from the ring oscillator 6. An internal up counter (for example, 16 bits) is caused to perform counting operation by this clock signal RCK. The counter-data latch circuit 5 causes the counter to perform up counting operation while the control timing signal UCE is being outputted. Thus, the counter-data latch circuit 5 counts the time equivalent to one period of the reference clock signal PREF by the clock signal RCK.

The counter data is processed as follow: a control timing signal DLS is outputted from the control circuit 2 in the fifth period of the sequence control period. This control timing signal is supplied as a latch signal DLC through the DCO 4. The above counter data is latched with the timing of this latch signal DLC. When the control timing signal CLR is outputted in the seventh period, the latched data is cleared.

The counter-data latch circuit 5 shifts the counted 16-bit data DT16–DT1 to the right side by, for example, six bits in accordance with the value "six" of multiplication factor setting data DV supplied from an external CPU (not show). Then the counter-data latch circuit 5 latches twelve bits of the shifted data. The latched 12-bit data is outputted as data CD12 to CD1 to the DCO 4. A multiplied clock signal POUT' outputted by the DCO 4 is divided into two parts through a frequency dividing circuit 39 for adjusting duty ratio, and outputted as a multiplied clock signal POUT.

Figure 1:
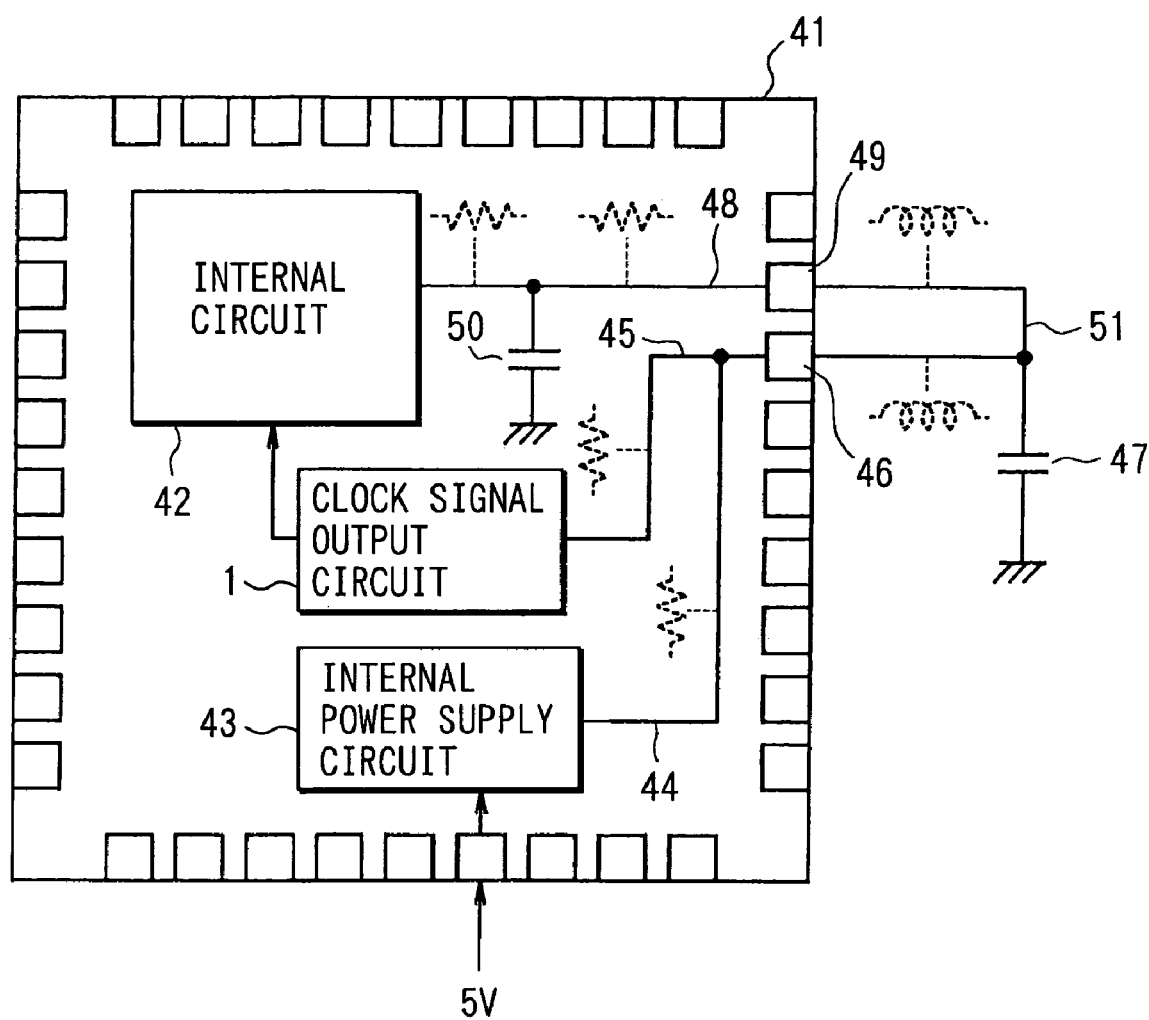
FIG. 1 is a schematic circuit diagram showing a one-chip microcomputer according to a first embodiment of the present invention.
Figure 2:
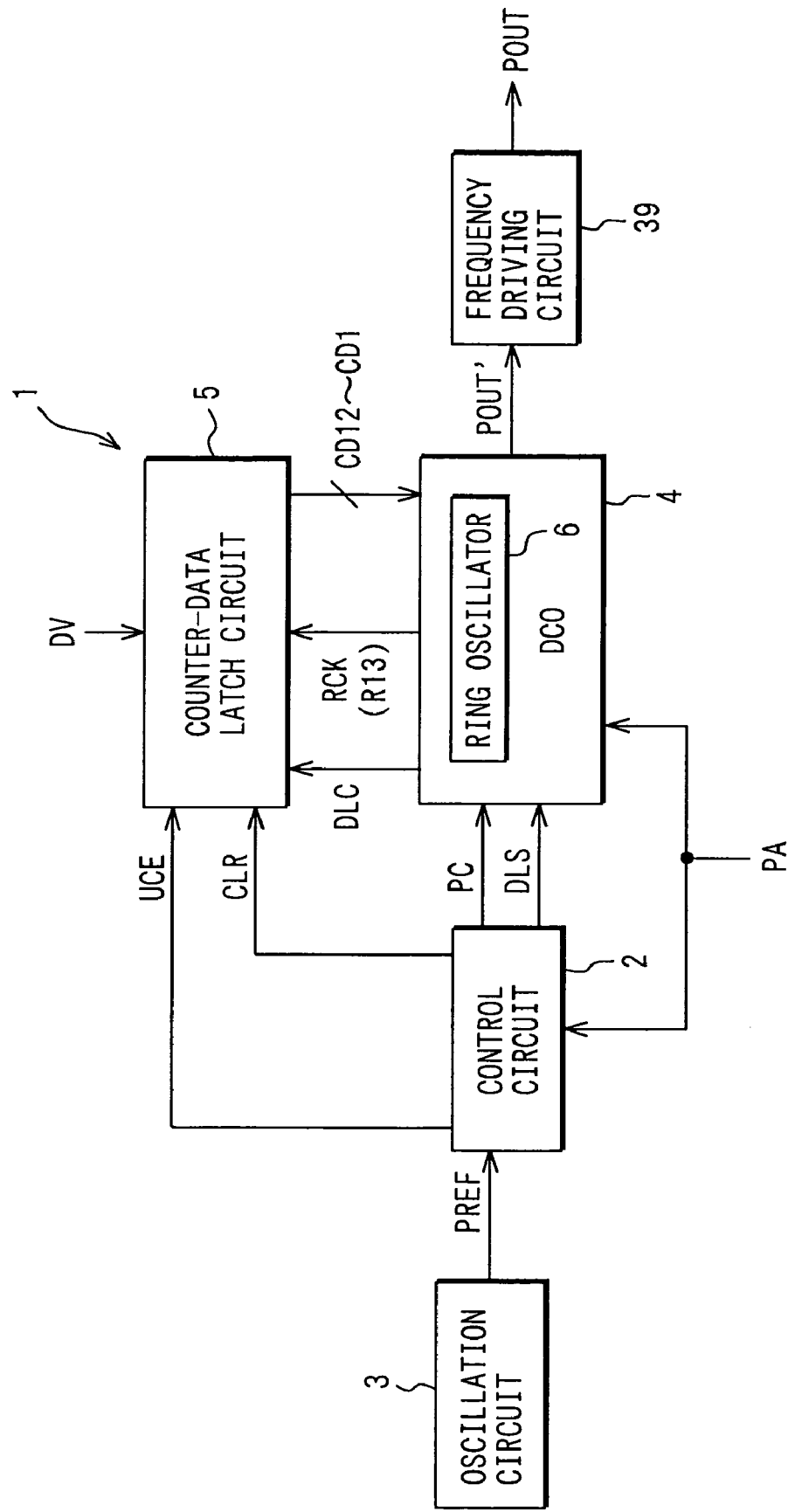
FIG. 2 is a block diagram showing a clock signal output circuit in the microcomputer according to the first embodiment.

FIG. 1 schematically illustrates the constitution of a one-chip microcomputer (integrated circuit device; hereafter, referred to as "micro") 41 mounted with the clock signal output circuit 1. The micro 41 is formed by mounting the clock signal output circuit 1, an internal circuit 42, and an internal power supply generation circuit 43 over a semiconductor substrate. The internal power supply generation circuit 43 comprises, for example, a series regulator and the like. Receiving power of 5V supplied from a source external to the micro 41, the internal power supply generation circuit 43 generates internal power of, for example, 3.3V, and supplies it to the clock signal output circuit 1 and the internal circuit 42.

The multiplied clock signal outputted by the clock signal output circuit 1 is supplied to the internal circuit 42. Though concrete graphic representation is omitted, the internal circuit 42 is, for example, CPU and its peripheral circuits (e.g. memory and gate array). The internal circuit 42 is constructed mainly of a logic circuit and the like that operate in synchronization with the above clock signal.

A power wiring 44 is connected to the power output terminal of the internal power supply generation circuit 43. A power wiring 45 is connected to the power supply terminal of the clock signal output circuit 1. The power wiring 44 and the power wiring 45 are connected in common to a capacitor connection terminal 46 that is an external terminal of the micro 41. The capacitor connection terminal 46 is connected to ground through a capacitor for noise removal 47. The capacitor for noise removal 47 removes the noise.

The capacitor for noise removal 47 is represented as one element in the figure; in fact, however, two capacitors respectively having a capacitance of 0.1 μF or so and a capacitance of 10 μF or so are connected in parallel. The former is provided mainly for removing high-frequency noise. The latter is provided mainly for the prevention of oscillation of the internal power supply generation circuit 43 (for supplying electric charges). This constitution is not specific to the embodiment but is common.

A power wiring 48 connected to the power supply terminal of the internal circuit 42 is connected to an external power supply terminal 49 that is an external terminal of the micro 41. The power wirings 44, 45, and 48 include bonding wires and lead frames. The power wiring 48 is connected with a capacitor for noise removal 50 lower in capacitance than the capacitor 47. The capacitance of the capacitor 50 is lower than that of the capacitor 47.

The capacitor for noise removal 50 is provided for removing noise in the internal circuit 42, and its capacitance is, for example, several nF. The external power supply terminal 49 is used in the following case: for example, when the micro 41 is subjected to burn-in testing before mounting, a supply voltage (e.g. 5V) higher than usual is externally supplied direct to the internal circuit 42.

Therefore, in the normal operation of the micro 41, the following procedure is taken: the capacitor connection terminal 46 and the external power supply terminal 49 are short-circuited to each other beforehand by a wiring pattern 51 or the like formed over a circuit board mounted with the micro 41. Internal power generated by the internal power supply generation circuit 43 is supplied to the internal circuit 42.

Figure 4:
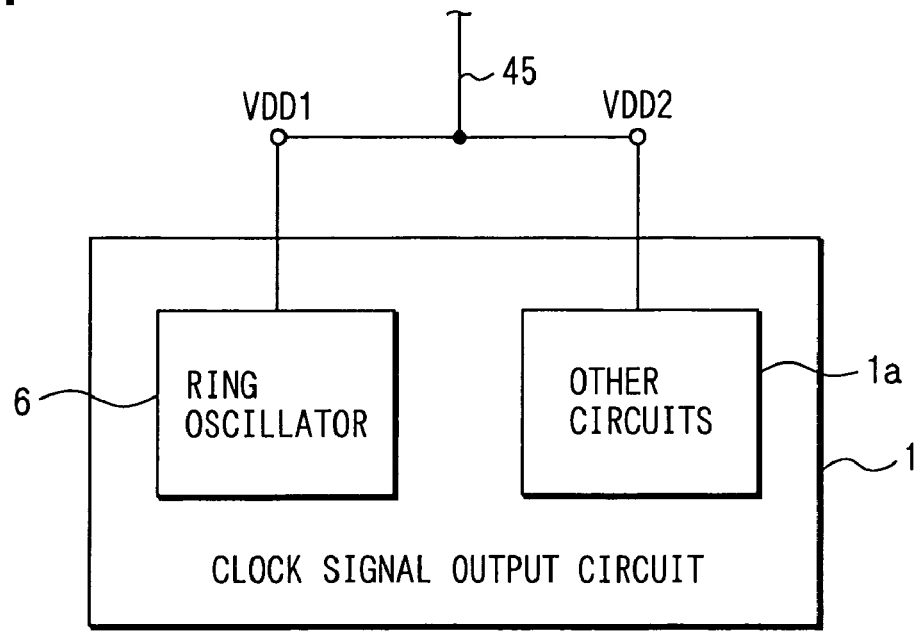
FIG. 4 is an ideal block diagram explaining a power supply path of the clock signal output circuit in the microcomputer according to the first embodiment.

FIG. 4 schematically illustrates the state of power supply in the clock signal output circuit 1. The terminal of the clock signal output circuit 1 is divided into a terminal VDD1 (first power supply terminal) for supplying power to the ring oscillator 6, and a terminal VDD2 (second power supply terminal) for supplying power to the other circuit portion 1a. The power supply terminals VDD1 and VDD2 are connected directly to the power wiring 45, and power supply to the ring oscillator 6 and that to the other circuit portion 1a are separated from each other. In this case, it is preferable that the wirings should be installed so that the formation of common impedance is prevented as much as possible. The other circuit portion 1a includes a pulse selector and a down counter that constitute the DCO 4 together with the ring oscillator 6, a timing control portion, and the like. (None of these elements is shown in the drawing.)

Next, description will be given to the action of this embodiment with reference to FIG. 5 to FIG. 8. It will be assumed that the power supply system for the micro 41 is laid out as illustrated in FIG. 1. When the internal circuit 42 operates in synchronization with the multiplied clock signal and thus such noise as to cause the internal supply voltage to fluctuate is superposed on the power wiring 48, the noise propagates as follows: the noise goes to the power supply terminal of the clock signal output circuit 1 by way of the external power supply terminal 49, the wiring pattern 51, the capacitor connection terminal 46, and the power wiring 45.

At this time, the low-frequency component of power supply noise is removed through a low-pass filter formed of the resistive component of the wiring in the above-mentioned propagation path and the capacitor 47. The high-frequency component of power supply noise is removed by the capacitor 50 and the inductance component of the wiring in the above-mentioned propagation path. Therefore, the influence of fluctuation in internal supply voltage is prevented from reaching the clock signal output circuit 1 side.

Figure 6:
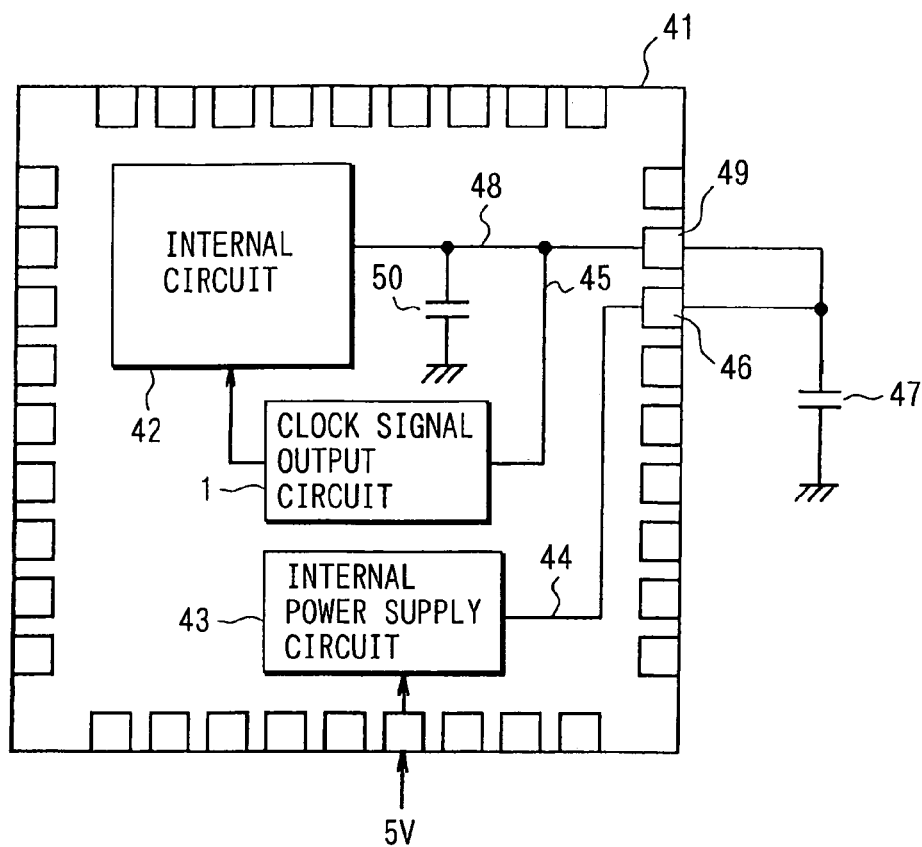
FIG. 6 is a schematic circuit diagram showing a one-chip microcomputer according to a comparison of the first embodiment.

To suppress fluctuation in internal supply voltage, the following constitution can be adopted: for example, FIG. 6 illustrates a case where the power supply terminal (power wiring 45) of the clock signal output circuit 1 is connected to the power wiring 48. More specific description will be given. When the clock signal output circuit 1 itself operates, that may cause the internal supply voltage to fluctuate. The constitution illustrated in FIG. 6 is intended to prevent the influence of that from reaching the internal power supply generation circuit 43. However, it was revealed that the constitution in FIG. 6 posed a problem. As described later, the influence directly made on the clock signal output circuit 1 by the internal circuit 42 being operated was greater.

Figure 7:
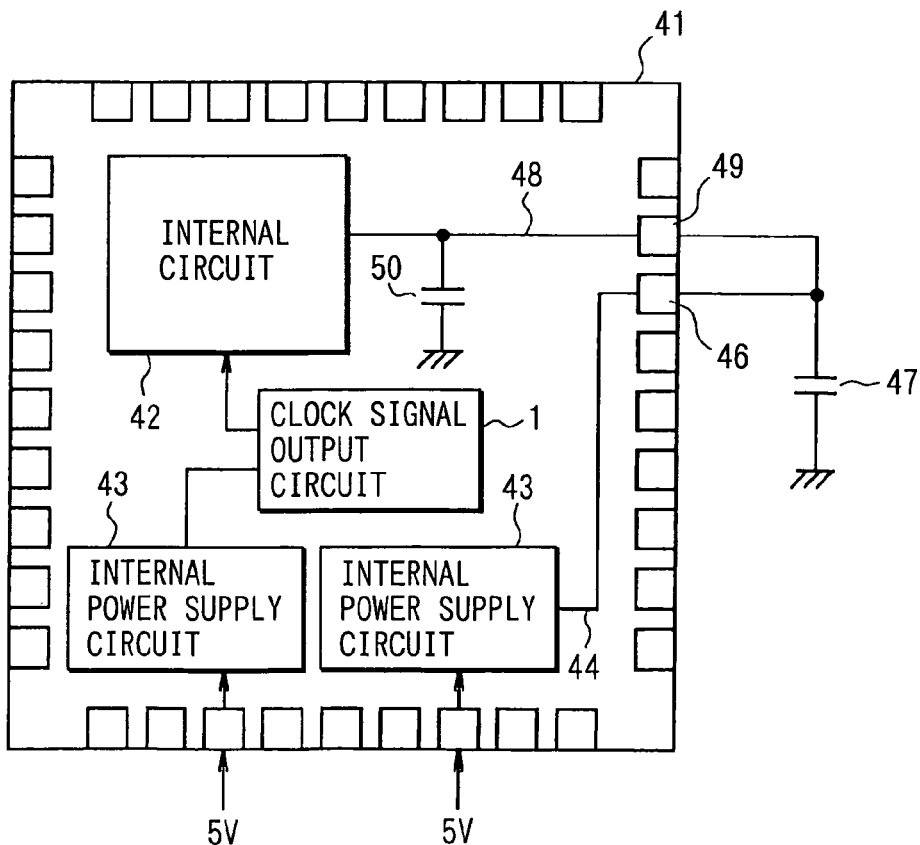
FIG. 7 is a schematic circuit diagram showing a one-chip microcomputer according to another comparison of the first embodiment.
Figure 8:
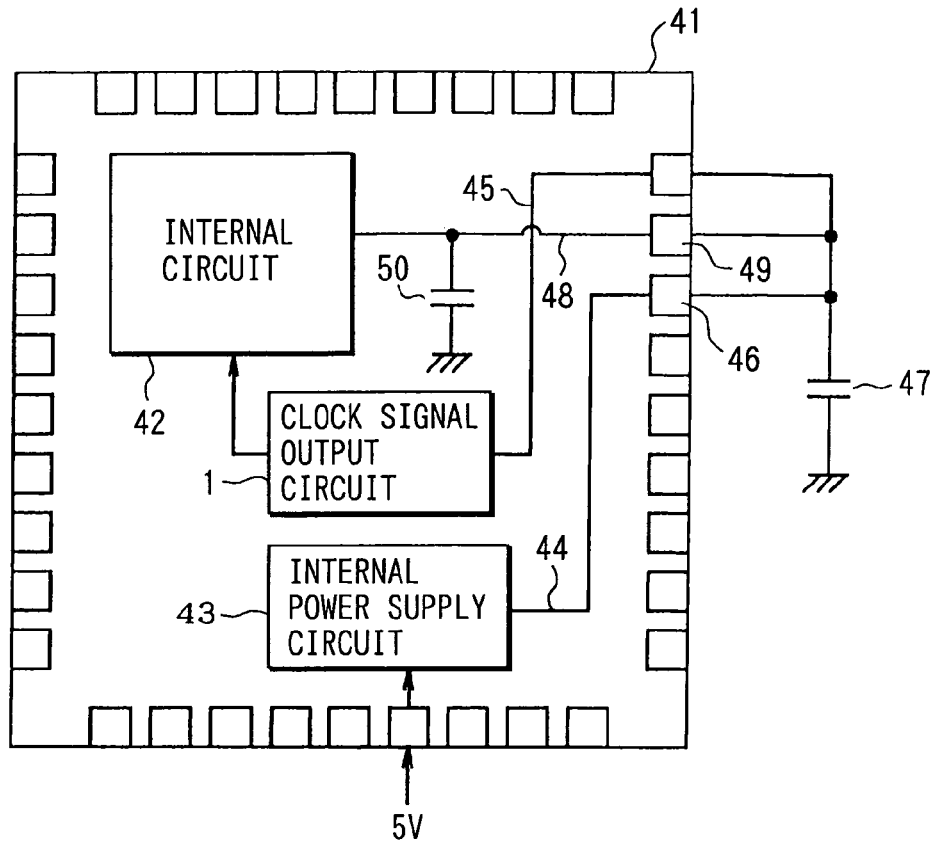
FIG. 8 is a schematic circuit diagram showing a one-chip microcomputer according to further another comparison of the first embodiment.

FIG. 7 illustrates a constitution in which another internal power supply generation circuit 43 is provided as a power supply dedicated to the clock signal output circuit 1. In this case, the influence of fluctuation in internal power supply due to the internal circuit 42 being operated does not reach the clock signal output circuit 1. However, since an additional chip area is required, this constitution is unfavorable. The illustration in FIG. 8 represents a constitution in which an external power supply terminal dedicated to the clock signal output circuit 1 is provided. Provision of an additional external terminal similarly leads to increase in chip size.

Figure 5:
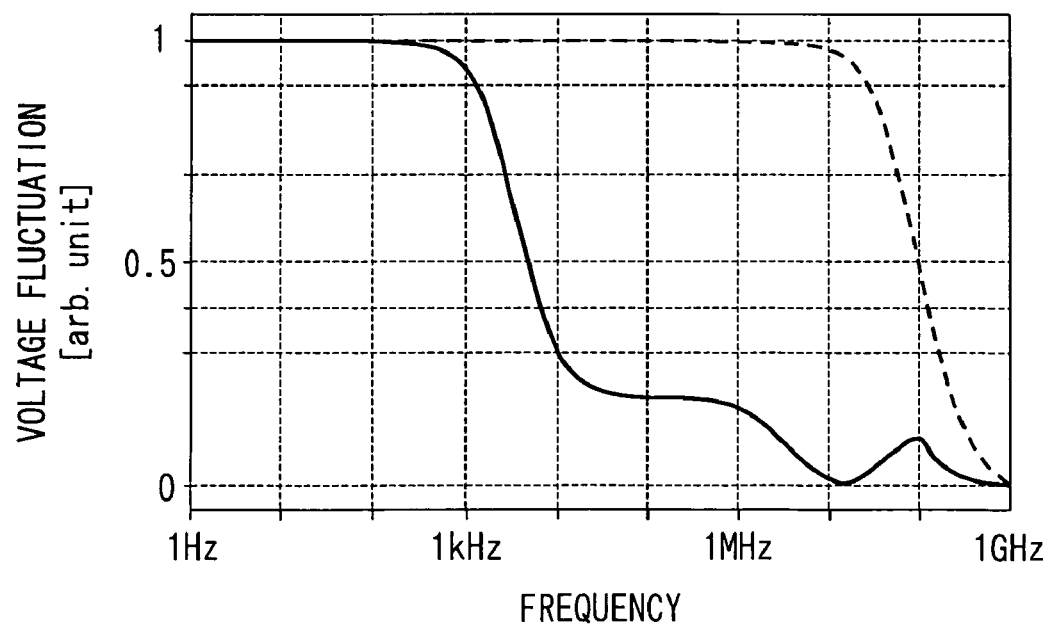
FIG. 5 is a graph showing a relationship between frequency and a voltage fluctuation in the microcomputer shown in FIG. 1.

FIG. 5 illustrates an example of the result of a simulation. In this simulation, the constitution of this embodiment in FIG. 1 and the constitution in FIG. 6 are compared with each other with respect to the following: the frequency component propagating to the clock signal output circuit 1 side when the internal circuit 42 operates. The horizontal axis represents frequency expressed on the LOG scale, and the vertical axis represents standardized voltage fluctuation level.

In the constitution illustrated in FIG. 6 (broken line), the voltage fluctuation component in the band of up to 10 MHz or so propagates to the clock signal output circuit 1 side. The fluctuation component exceeding 10 MHz is probably removed by the noise removing action of the internal capacitor 50. More specific description will be given. The capacitance of a capacitor usually formed in a chip is between several nF or so and several tens of nF or so at the maximum, as mentioned above. In the constitution illustrated in FIG. 6, the fluctuation component of 10 MHz or below is very difficult to remove.

In the constitution of this embodiment (solid line), in addition to the capacitor 50 internal to the chip, the power wiring 48, the wiring pattern 51, the capacitor 47, and the power wiring 45 exist between the internal circuit 42 and the clock signal output circuit 1. As a result, the capacitance of the capacitor 47 and the resistive component of each wiring are added, and thus the time constant is increased. Consequently, the fluctuation component of 1 kHz or above is probably removed. The effect of the low-pass filter with a cutoff frequency of 1 kHz probably arises mainly from the resistive component of the power wiring 48 and the time constant of the capacitor 47. Attenuation in proximity to 10 MHz probably arises mainly from the inductance components of the capacitor 50, external wiring pattern 51, and the like The internal power supply generation circuit 43 exists on the clock signal output circuit 1 side. The response frequency arising from a circuit constant constituting the internal power supply generation circuit 43 is generally several hundreds of kHz to several MHz or so. Therefore, the band of 1 kHz or below is probably covered by the internal power supply generation circuit 43.

From the viewpoint of the internal power supply generation circuit 43, the clock signal output circuit 1 itself is also one of factors that cause power supply fluctuation. To ultimately stabilize the oscillating operation in the clock signal output circuit 1, the following can be provided: the constitution illustrated in FIG. 1 is superior to that illustrated in FIG. 6 in total balance.

As mentioned above, this embodiment is so constructed that the following is performed: internal power generated by the internal power supply generation circuit 43 is supplied to the internal circuit 42 by way of the power wiring 44, the capacitor connection terminal 46, the external wiring pattern 51, the external power supply terminal 49, and the power wiring 48. The clock signal output circuit 1 is supplied with the internal power by connecting the power wiring 45 to the capacitor connection terminal 46.

Therefore, the following can be achieved without increasing the chip size or adding an external component: when internal power fluctuates due to the internal circuit 42 being operated and noise is superposed on the power wiring 48, the noise can be removed by the time constant supplied by the above-mentioned supply path and the capacitors 47 and 50 connected to the path. Thus, its influence can be suppressed from reaching the clock signal output circuit 1 as much as possible. In addition, the oscillating operation of the ring oscillator 6 can be stabilized to further stabilize the frequency of the multiplied clock signal.

Internal power is supplied to all the circuits constituting the clock signal output circuit 1 in a lump. Therefore, the supply voltage supplied to the ring oscillator 6 and that supplied to the other circuits are brought to the same level. Thus, the operation of the clock signal output circuit 1 can be further stabilized. The external power supply terminal 49 is provided, and it and the capacitor connection terminal 46 are connected with each other through the external wiring pattern 51. Therefore, when the micro 41 is subjected to burn-in testing, over-voltage can be externally and directly applied.

The first and second power supply terminals VDD1 and VDD2 are connected directly to the power wiring 45. Thus, the ring oscillator 6 and the other circuit portion 1a are respectively supplied with internal power. Therefore, even in the clock signal output circuit 1, the ring oscillator 6 and the other circuit portion 1a are individually operated, and they can be avoided from influencing each other through the power wiring.

The capacitor 47 is connected to the wiring pattern 51 that connects the capacitor connection terminal 46 and the external power supply terminal 49 outside the micro 41. Therefore, the functions of the capacitor for noise removal can be more effectively exercised than in cases where the capacitor 47 is connected to the power wiring internal to the micro 41 at one point, or the capacitor connection terminal 46.

More specific description will be given. Ti can be considered that the power wiring 48 for the internal circuit 42 is connected directly to the capacitor connection terminal 46. In this case, the capacitor 47 is not connected as a point to the paths of the power wirings 48 and 45 in the chip of the micro 41. In reality, the capacitor 47 is connected to the paths through wiring such as a lead frame in the chip.

In this case, it cannot be said that the capacitor 47 is connected to a path through which a power current is directly passed; therefore, the action of the capacitor for noise removal is slightly weakened. However, when the external power supply terminal 49 is provided and the external wiring pattern 51 is connected between it and the capacitor connection terminal 46, the following advantage is brought: an internal power current is passed through the wiring pattern 51, and thus the functions of the capacitor for noise removal are more effectively carried out.

(Second Embodiment)

Figure 9:
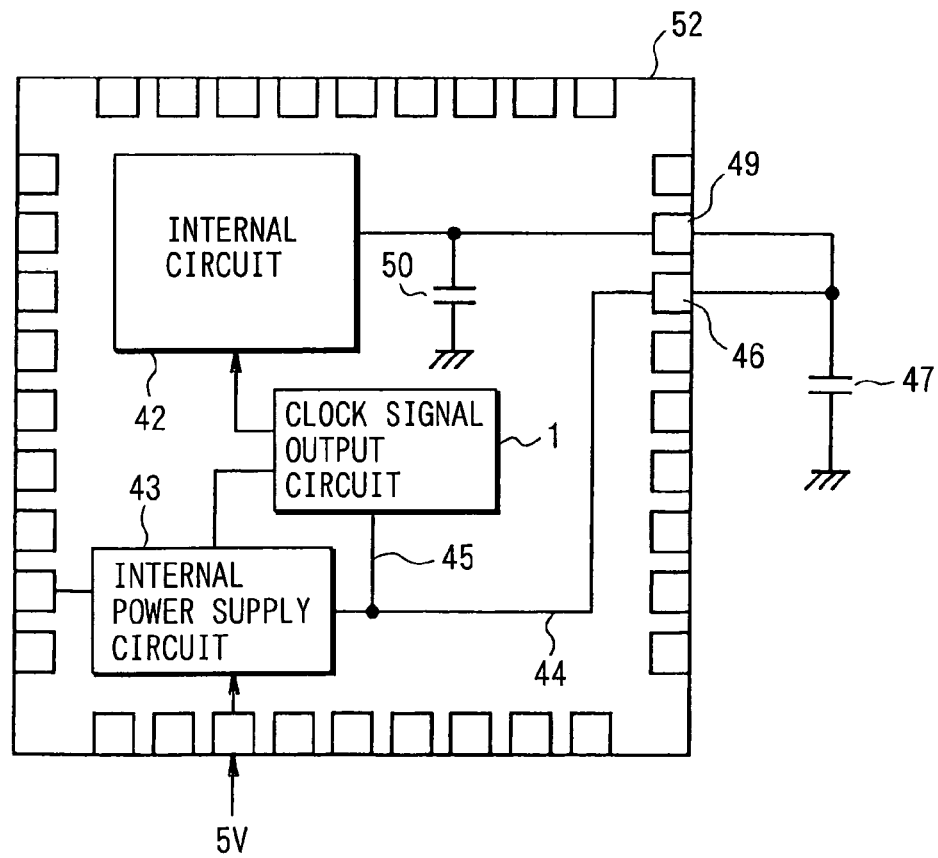
FIG. 9 is a schematic circuit diagram showing a one-chip microcomputer according to a second embodiment of the present invention.

FIG. 9 illustrates a second embodiment of the present invention. In FIG. 9, the same members as in the first embodiment will be marked with the same reference numerals, and the description of such members will be omitted. Hereafter, description will be given only to differences between them. In a one-chip microcomputer (integrated circuit device) 52 according to the second embodiment, the power wiring 45 of the clock signal output circuit 1 is connected to the vicinity of the power output terminal of the internal power supply generation circuit 43. The other aspects of the constitution are the same as those of the first embodiment.

In the second embodiment constructed as mentioned above, the impedance of wiring between the capacitor connection terminal 46 and the junction point between the power wirings 44 and 45 is increased from the viewpoint of the clock signal output circuit 1. Therefore, the effect of the low-pass filter is further enhanced, and fluctuation in supply voltage due to the operation of the internal circuit 42 can be further suppressed.

The present invention is not limited to the embodiments mentioned above and illustrated in the drawings, and the following modifications or expansions can be carried out:

The power supply terminals of the clock signal output circuit 1 may be integrated, and all the elements in the internal circuit can be supplied with power in a lump. At least the ring oscillator 6 can be so constructed that internal power is supplied before passage through the capacitor connection terminal 48. Thus, the influence of fluctuation in internal supply voltage can be prevented from reaching the ring oscillator 6.

Power supply to the clock signal output circuit 1 can be carried out anywhere between the power output terminal of the internal power supply generation circuit 43 and the capacitor connection terminal 48.

When a damping resistance is placed in the power wiring 44 in the second embodiment, the effect of the low-pass filter can be further enhanced.

When the capacitor for noise removal is also connected to the power wiring 44, the following effect is brought about: the influence of the clock signal output circuit 1 being operated is prevented from reaching the internal power supply generation circuit 43 side.

The external power supply terminal 49 can be provided as required.

Also, the capacitor 50 can be disposed as required.

The present invention is applicable not only to microcomputers but also to integrated circuit devices provided with internal circuits such as DSP and DMA controller that operate in-synchronization with clock.

(Third Embodiment)

Figure 10:
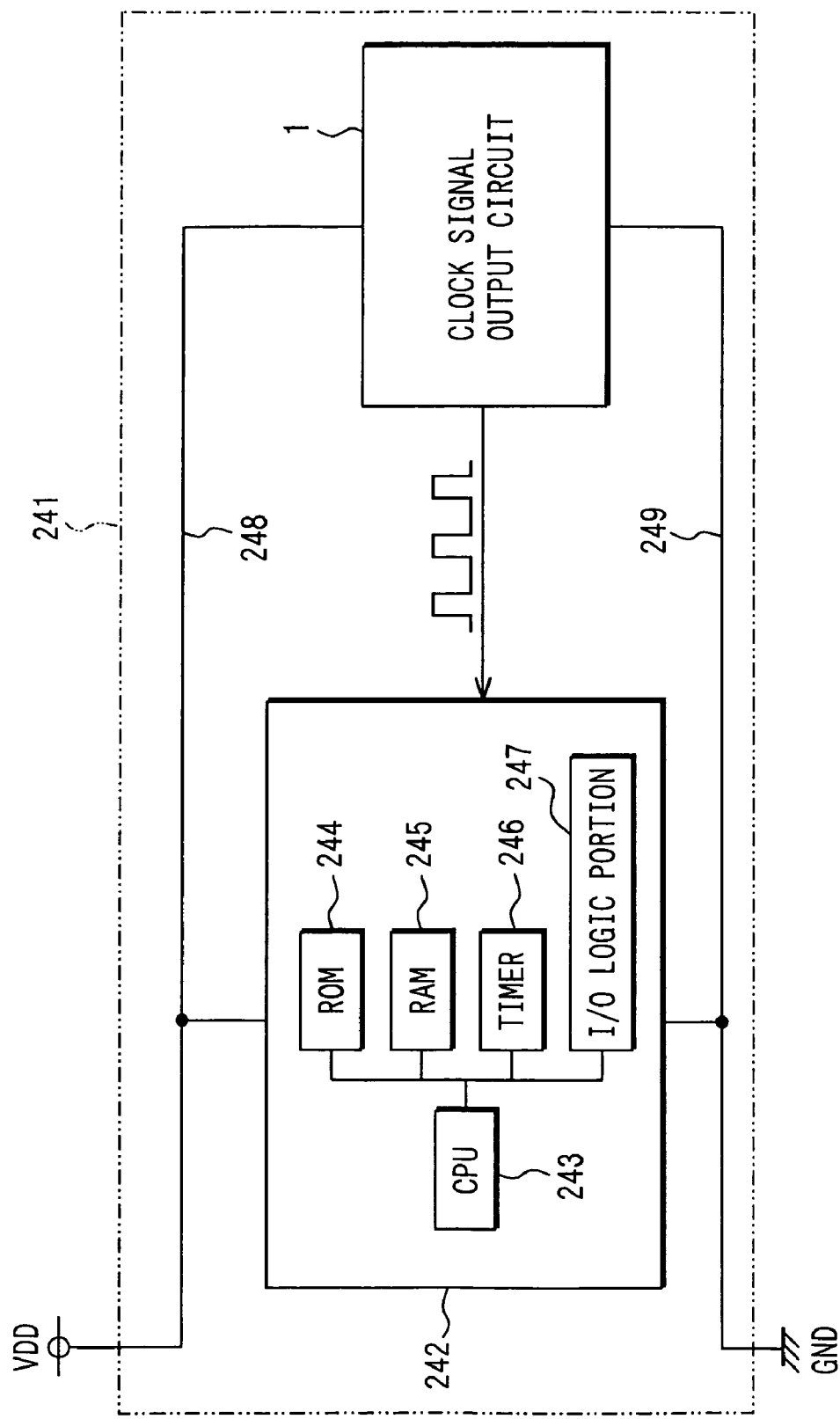
FIG. 10 is a block diagram showing a one-chip microcomputer according to a third embodiment of the present invention.

FIG. 10 schematically illustrates the constitution of a one-chip microcomputer 241 according to a third embodiment of the present invention mounted with the clock signal output circuit 1. The micro 241 is constructed by mounting the clock signal output circuit 1 and an internal circuit 242 over a semiconductor substrate. The internal circuit 242 is supplied with a multiplied clock signal outputted by the clock signal output circuit 1 and is thereby operated. The internal circuit 242 includes, for example, a CPU 243, a ROM 244, a RAM 245, a timer 246, an I/O logic portion 47, and the like. (These elements are strictly for example purposes.)

The micro 241 is externally supplied with 5V power VDD. A power wiring 248 is routed in the micro 241 so that this power is supplied to the internal circuit 242 first and then to the clock signal output circuit 1. A ground-side wiring 249 is routed similarly with the power wiring 248.

Next, description will be given to the action of this embodiment with reference to FIGS. 11A to 11C as well. The internal circuit 242 operates in synchronization with the multiplied clock signal outputted by the clock signal output circuit 1. However, the CPU 243, the ROM 244, the RAM 245, the timer 246, the I/O logic portion 247, and the like do not always simultaneously operate. That is, some may operate and others may not depend on the state of processing from time to time. The consumption current of the internal circuit 242 differs depending on their ratio, and thus the voltage of power supply VDD fluctuates according to variation in consumption current.

Since the power wiring 248 and the ground wiring 249 are routed in the micro 241 as mentioned above, fluctuation in the supply voltage generated by the internal circuit 242 propagates to the clock signal output circuit 1 side through the power wiring 248. Thus, in the clock signal output circuit 1, the NAND gates 7 and 8 and delay gates as INV gates 9 to 38 constituting the ring oscillator 6 are influenced by this supply voltage fluctuation. As a result, their respective gate delay times vary, and the frequencies of a clock signal RCK and the like oscillated and outputted by the ring oscillator 6 fluctuate. This results in fluctuation in the frequency of the multiplied clock signal outputted by the clock signal output circuit 1.

Figure 11A:
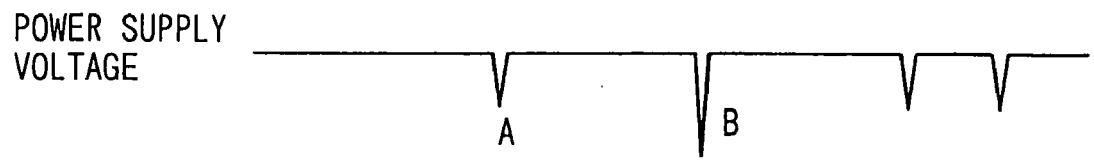
FIG. 11A is a graph showing a power supply voltage fluctuation.
Figure 11B:
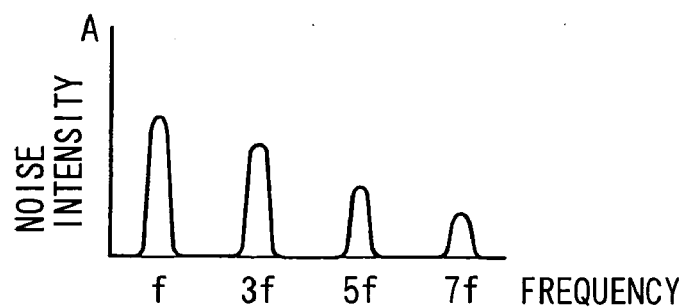
FIGS. 11B and 11C are graphs showing a relationship between frequency and noise intensity of the power supply voltage fluctuation shown in FIG. 11A, according to the third embodiment.
Figure 11C:
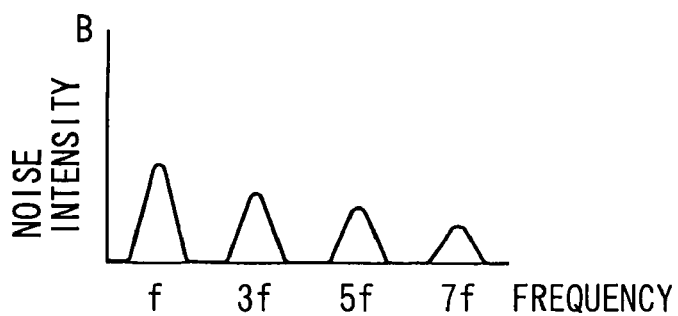

FIGS. 11A to 11C conceptually illustrate examples (FIGS. 11B and 11C) of the frequency spectrum of noise produced in the micro 241 when such supply voltage fluctuation A and B as illustrated in FIG. 11A occurs. More specific description will be given. With respect to the an impulse-like noise A, which is smaller in maximum amplitude, and another impulse-like noise B, which is larger in maximum amplitude, the following can be observed: the frequency spectrum whose peak is located at fundamental frequency f, harmonic contents three times, five times, and seven times as large as the fundamental frequency ranges over wider bands in the noise B than in the noise A. The peak in the noise intensity is lower in the noise B than in the noise A.

This arises from the following fact: as illustrated in FIG. 11A, the supply voltage fluctuates, and thus the frequency of the multiplied clock signal outputted from the clock signal output circuit 1 fluctuates. That is, the width of fluctuation in the frequency of the multiplied clock signal outputted by the clock signal output circuit 1 is increased with increase in fluctuation in supply voltage. Therefore, the bands of the frequency spectrum of noise tend to further expand.

With the constitution of this embodiment, as mentioned above, the peaks in noise intensity are lowered by taking the following procedure: the supply voltage on the clock signal output circuit 1 side is daringly caused to fluctuate according to variation in the consumption current of the internal circuit 242. Thus, the frequency of the multiplied clock signal outputted by the clock signal output circuit 1 is varied, and the distribution of the frequency spectrum of noise is thereby expanded.

As mentioned above, this embodiment is constructed as follows: in the micro 241, power supply and ground are shared between the clock signal output circuit 1 and the internal circuit 242. The clock signal output circuit 1 is provided with the ring oscillator 6 and generates and outputs the multiplied clock signal by digital PLL operation. The internal circuit 242 is supplied with the clock signal and is thereby operated. The power wiring 248 and the ground wiring 249 are so installed that power supply is directed to the internal circuit 242 first and then to the clock signal output circuit 1 through the wirings 248 and 249.

Thus, the frequency of the multiplied clock signal is varied according to fluctuation in supply voltage. Consequently, the energy of unwanted radiated noise produced based on the multiplied clock signal can be dispersed over wide frequency bands, and the peaks in noise level can be lowered. Therefore, unlike the technology disclosed in Japanese Unexamined Patent Publication No. 2001-148690, a special circuit need not be constructed for varying the clock signal frequency. Thus, the micro 241 including the clock signal output circuit 1 can be constructed in small size.

Accordingly, in the integrated circuit device according to the third embodiment of the present invention, power supply and ground are shared between the clock signal output circuit 1 and the internal circuit 242. The clock signal output circuit 1 is provided with the ring oscillator 6 and generates and outputs a multiplied clock signal by digital PLL (Digital Phase Locked Loop, DPLL) operation. The internal circuit 242 is supplied with the clock signal and is thereby operated. Power wiring and ground wiring are so installed that the shared power supply is directed to the internal circuit 242 first, and then to the clock signal output circuit 1.

Figure 12:
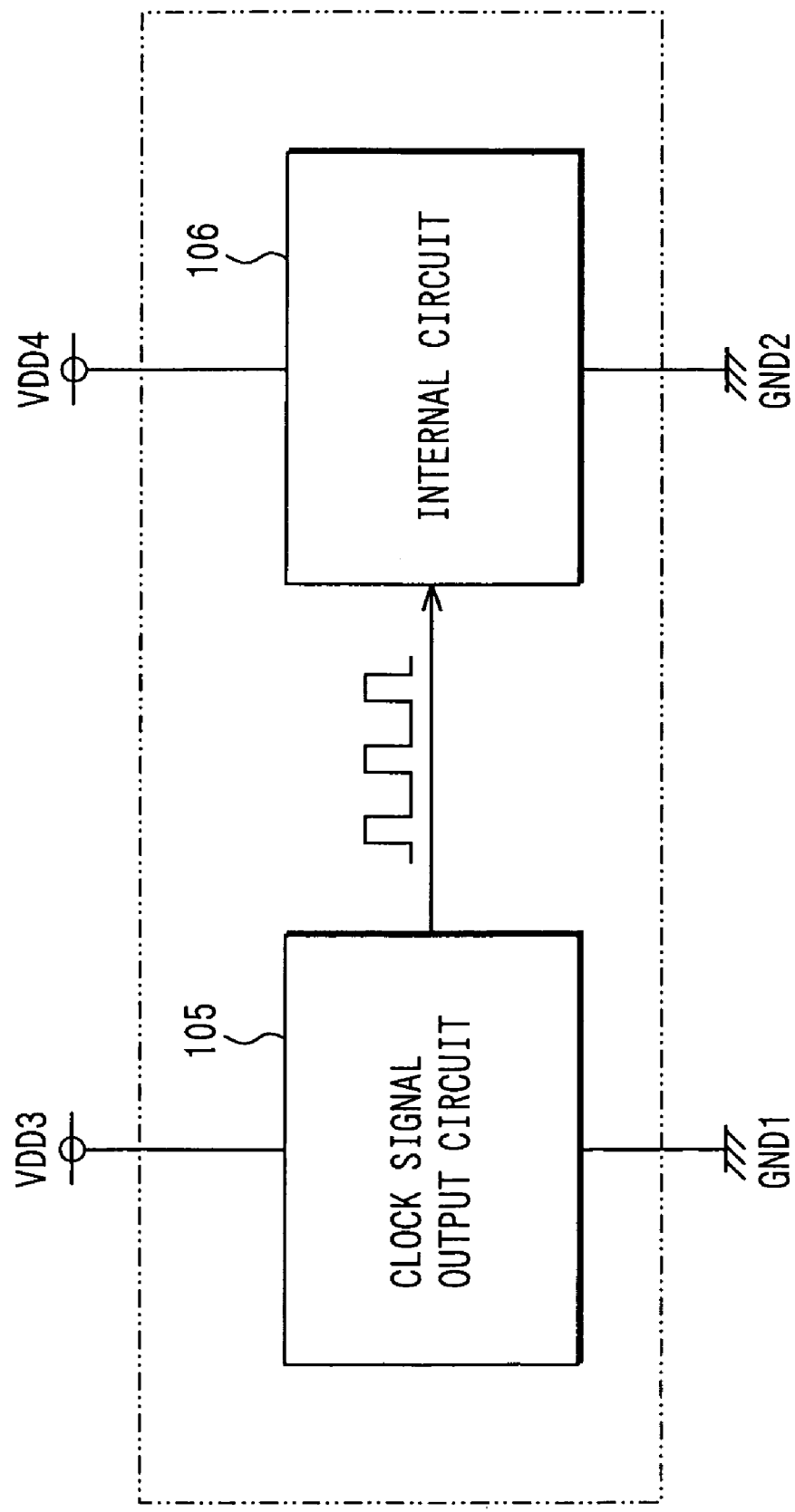
FIG. 12 is an ideal block diagram explaining a comparison one-chip microcomputer, according to the first embodiment.

More specific description will be given. In the clock signal output circuit 1 constructed as mentioned above, the ring oscillator 6 oscillates clock signals at as high speed as the order of several hundreds of MHz. Therefore, noise is prone to be superposed on power supply. Therefore, conventional integrated circuit devices provided with a clock signal output circuit are generally constructed as illustrated in FIG. 12. That is, power supply and ground are separated between a clock signal output circuit 105 and another internal circuit 106 (VDD3, VDD4/GND1, GND2). By adopting such a constitution, the individual circuits are prevented from influencing each other when they individually operate.

In the present embodiment, they are daringly connected in common. More specific description will be given. The internal circuit 242 operates in synchronization with a clock signal. The consumption current varies according to the number of circuit portions that operate in synchronization with clock depending on the state of occasion-by-occasion processing. For this reason, supply voltage is varied. Therefore, when power supply and ground are connected in common, fluctuation in supply voltage caused by the internal circuit 242 propagates to the clock signal output circuit 1 side. As a result, the supply voltage of the clock signal output circuit 1 fluctuates as well.

Consequently, on the clock signal output circuit 1 side, the delay times of delay gates constituting the ring oscillator 6 vary according to supply voltage fluctuation. Therefore, the frequency of the oscillating operation in the ring oscillator 6 varies. As a result, the frequency of the multiplied clock signal outputted from the clock signal output circuit 1 varies as well. Therefore, the energy of unwanted radiated noise produced based on the multiplied clock signal is dispersed over wide frequency bands, and the peaks in noise level can be lowered. Therefore, unlike the technology disclosed in Japanese Unexamined Patent Publication No. 2001-148690, a special circuit need not be constructed for varying the clock signal frequency. Thus, the integrated circuit device 241 can be constructed in small size.

Figure 13:
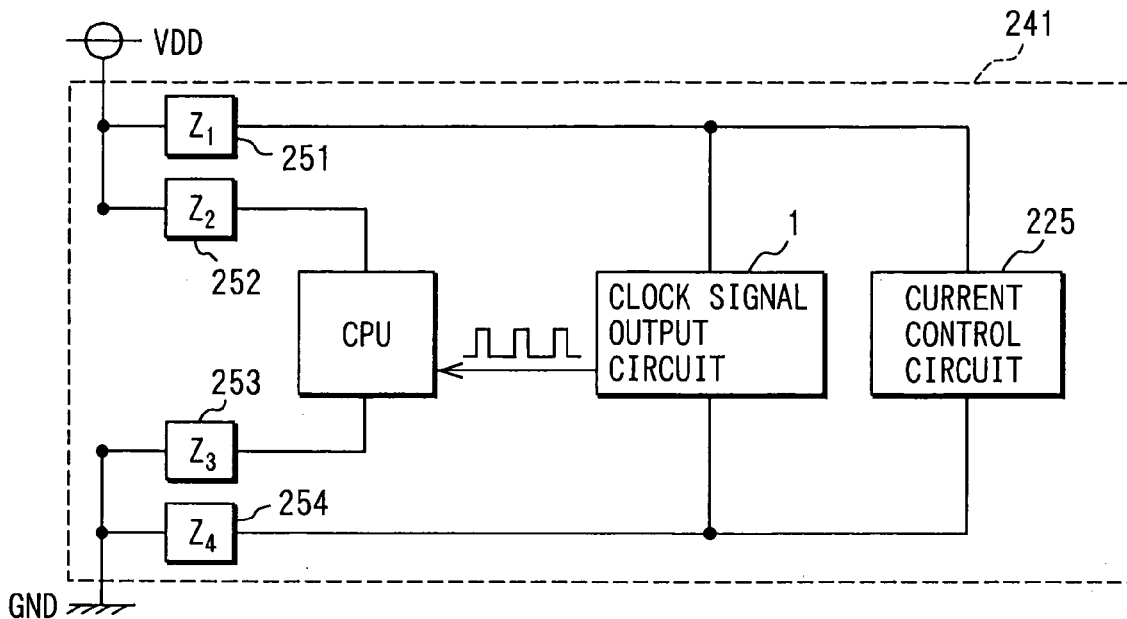
FIG. 13 is a block diagram showing a one-chip microcomputer according to a modification of the third embodiment.
Figure 14:
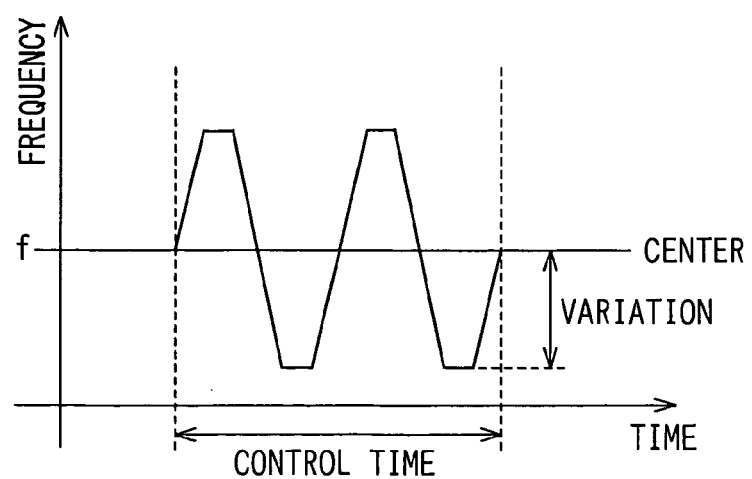
FIG. 14 is a graph showing a relationship between time and frequency of a current in the microcomputer shown in FIG. 13.
Figure 15:
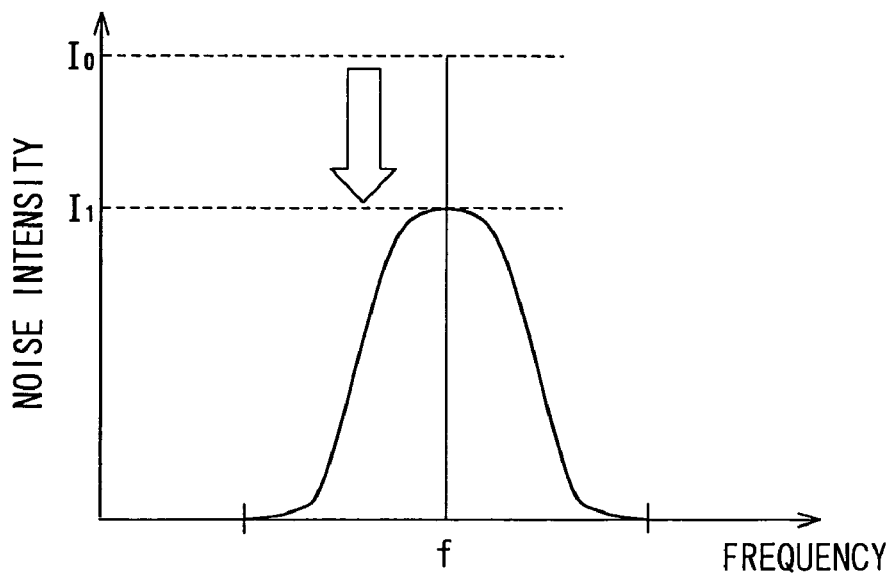
FIG. 15 is a graph showing a relationship between frequency and noise intensity in the microcomputer shown in FIG. 13.
Figure 16:
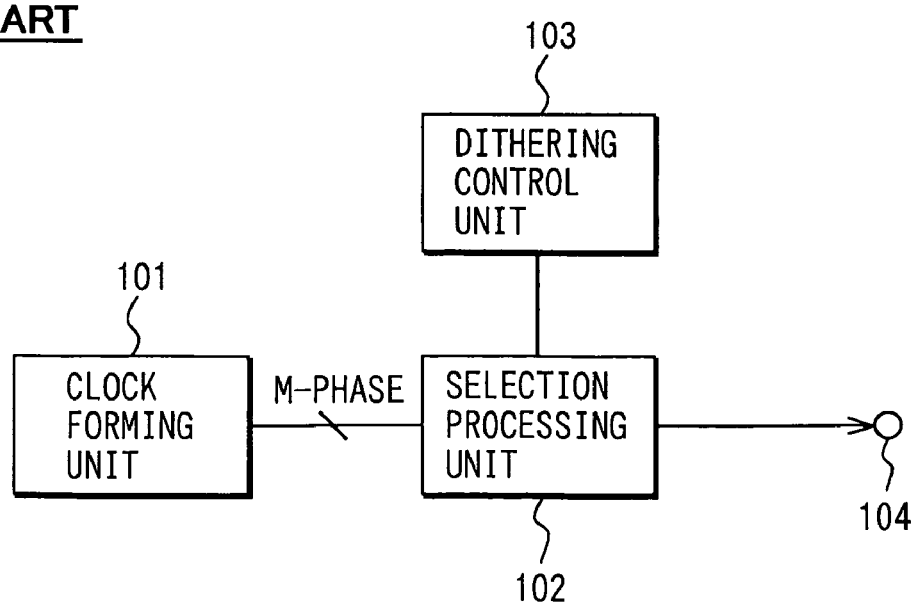
FIG. 16 is a block diagram showing a one-chip microcomputer according to a prior art.

The micro 241 can further include a current control circuit 255, as shown in FIG. 13. The micro 241 has the first to fourth impedances 251–254. In this case, the current control circuit 255 controls a current flowing through the micro 241. The current control circuit 255 is connected in parallel with the clock signal output circuit 1 so that a current flowing through the clock signal output circuit 1 can be varied. By controlling the current flowing through the clock signal output circuit 1, the voltage of the clock signal output circuit 1 can be varied. Thus, in a predetermined control time, the frequency can be varied around the center frequency, as shown in FIG. 14. Accordingly, the intensity of the noise at the center frequency is reduced from an initial intensity $I_0$ to a reduced intensity $I_1$, as shown in FIG. 15.

The present invention is not limited to the embodiment mentioned above and illustrated in the drawings, and the following modifications or expansions can be carried out:

The present invention is applicable not only to microcomputers but also any integrated circuit as long as the integrated circuit is so constructed that it comprises: a clock signal output circuit that multiplies clock frequency by digital PLL operation based on a clock signal generated by a ring oscillator; a logic circuit that is supplied with the multiplied clock signal and is thereby operated; and the like.

Such changes and modifications are to be understood as being within the scope of the present invention as defined by the appended claims.

What is claimed is:

1. Integrated circuit device comprising:
a wiring;
a clock signal output circuit including a ring oscillator, wherein the ring oscillator includes a plurality of delay gates, which is connected each other annularly and generates a clock signal with a frequency of a reference clock signal, and wherein the clock signal output circuit generates and outputs a multiplied clock signal obtained by multiplying the frequency of the reference clock signal with a digital phase locked loop method on the basis of the clock signal;
an internal circuit operated on the basis of the multiplied clock signal;
an internal power supply generation circuit for supplying an electric power to the clock signal output circuit and to the internal circuit on the basis of a power supplied from an external circuit, wherein the electric power is stabilized by reducing a voltage of the power from the external circuit; and
a capacitor connection terminal for connecting an external noise reduction capacitor to the wiring connecting to the internal circuit, wherein
the wiring connects among the clock signal output circuit, the internal circuit and the internal power supply generation circuit,
the internal power supply generation circuit supplies the electric power to the ring oscillator through the wiring connecting between the internal power supply generation circuit and the capacitor connection terminal, and
the internal power supply generation circuit supplies the electric power to the internal circuit through the wiring connecting to the capacitor connection terminal.

2. The device according to claim 1, wherein
the clock signal output circuit, the internal circuit and the internal power supply generation circuit are integrated in a semiconductor substrate.

3. The device according to claim 1, further comprising an internal capacitor for reducing a noise, wherein
the wiring includes a wire lead frame,
the wiring has a wiring impedance,
the wire lead frame has another impedance,
the internal capacitor has a capacitance,
the external noise reduction capacitor has another capacitance, and
the wiring impedance of the wire, the other impedance of the wire lead frame, the capacitance of the internal capacitor and the other capacitance of the external noise reduction capacitor provide a filter for filtering the noise.

4. The device according to claim 3, wherein
the wiring impedance of the wire includes a resistance component, and
the impedance of the wire lead frame includes an inductance component.

5. The device according to claim 1, wherein
the internal power supply generation circuit supplies the electric power to all parts composing the clock signal output circuit through the wiring connecting between the internal power supply generation circuit and the capacitor connection terminal.

6. The device according to claim 5, wherein
the clock signal output circuit further includes a first power supply terminal and a second power supply terminal,
the first power supply terminal is capable of supplying the electric power to the ring oscillator,
the second power supply terminal is capable of supplying the electric power to all parts of the clock signal output circuit except for the ring oscillator, and
the first and the second power supply terminals are connected directly to the internal power supply generation circuit.

7. The device according to claim 6, wherein
the first and the second power supply terminals are independent each other.

8. The device according to claim 1, further comprising an internal capacitor for reducing a noise, wherein
the internal capacitor has a capacitance, which is lower than a capacitance of the external noise reduction capacitor, and
the internal circuit includes a power supply terminal connecting to the internal capacitor.

9. The device according to claim 1, further comprising
an external power supply terminal for connecting to the external circuit, wherein
the internal circuit includes a power supply terminal only connecting to the external power supply terminal so that the internal circuit is energized through a connection between the capacitor connection terminal and the external power supply terminal, the connection being disposed outside of the device.

10. The device according to claim 1, wherein
the internal power supply generation circuit includes an output terminal for supplying the electric power, and
the output terminal of the internal power supply generation circuit is disposed near a power supply terminal of the clock signal output circuit.

11. The device according to claim 10, wherein
the output terminal of the internal power supply generation circuit and the power supply terminal of the clock signal output circuit are connected at a connection portion, and
the wiring connecting between the capacitor connection terminal and the connection portion has a large wiring impedance.

12. Integrated circuit device comprising:
a clock signal output circuit including a ring oscillator, wherein the ring oscillator includes a plurality of delay gates, which is connected each other annularly and generates a clock signal with a frequency of a reference clock signal, and wherein the clock signal output circuit generates and outputs a multiplied clock signal obtained by multiplying the frequency of the reference clock signal with a digital phase locked loop method on the basis of the clock signal;
an internal circuit operated on the basis of the multiplied clock signal;
a ground, wherein
the clock signal output circuit and the internal circuit are commonly energized from a power supply,
the clock signal output circuit and the internal circuit are commonly grounded to the ground,
the power supply supplies an electric power to the internal circuit firstly, and
the power supply supplies the electric power to the clock signal output circuit secondary,
a wiring;
an internal power supply generation circuit for supplying an electric power to the clock signal output circuit and to the internal circuit on the basis of a power supplied from an external circuit, wherein the electric power is stabilized by reducing a voltage of the power from the external circuit; and
a capacitor connection terminal for connecting an external noise reduction capacitor to the wiring connecting to the internal circuit, wherein the wiring connects among the clock signal output circuit, the internal circuit and the internal power supply generation circuit,
the internal power supply generation circuit supplies the electric power to the ring oscillator through the wiring connecting between the internal power supply generation circuit and the capacitor connection terminal, and
the internal power supply generation circuit supplies the electric power to the internal circuit through the wiring connecting to the capacitor connection terminal.

13. The device according to claim 12, further comprising
an internal capacitor for reducing a noise, wherein
the wiring includes a wire lead frame,
the wiring has a wiring impedance,
the wire lead frame has another impedance,
the internal capacitor has a capacitance,
the external noise reduction capacitor has another capacitance, and
the wiring impedance of the wire, the other impedance of the wire lead frame, the capacitance of the internal capacitor and the other capacitance of the external noise reduction capacitor provide a filter for filtering the noise.

14. The device according to claim 12, wherein
the internal power supply generation circuit supplies the electric power to all parts composing the clock signal output circuit through the wiring connecting between the internal power supply generation circuit and the capacitor connection terminal.

15. The device according to claim 12, further comprising
an internal capacitor for reducing a noise, wherein
the internal capacitor has a capacitance, which is lower than a capacitance of the external noise reduction capacitor, and
the internal circuit includes a power supply terminal connecting to the internal capacitor.

16. The device according to claim 12, further comprising
an external power supply terminal for connecting to the external circuit, wherein
the internal circuit includes a power supply terminal only connecting to the external power supply terminal so that the internal circuit is energized through a connection between the capacitor connection terminal and the external power supply terminal, the connection being disposed outside of the device.

* * * * *